United States Patent
Mergen et al.

(10) Patent No.: US 7,572,521 B2
(45) Date of Patent: Aug. 11, 2009

(54) ALUMINUM ALLOY FOR SURFACES WHICH ARE SUBJECTED TO EXTREME STRESSES DUE TO FRICTION

(75) Inventors: Robert Mergen, Altmünster (AT); Walter Gärtner, Gmunden (AT)

(73) Assignee: Miba Gleitlager GmbH, Laakirchen (AT)

( * ) Notice: Subject to any disclaimer, the term of this patent is extended or adjusted under 35 U.S.C. 154(b) by 599 days.

(21) Appl. No.: 11/196,561

(22) Filed: Aug. 3, 2005

(65) Prior Publication Data
US 2006/0029827 A1 Feb. 9, 2006

(30) Foreign Application Priority Data
Aug. 3, 2004 (AT) .............................. A 1329/2004

(51) Int. Cl.
*B32B 15/01* (2006.01)
*B32B 15/04* (2006.01)

(52) U.S. Cl. ...................... 428/650; 420/530; 420/531; 420/533; 420/537; 420/538; 420/539; 420/540; 420/542; 420/548; 420/550; 420/552; 420/554; 148/437; 148/438; 148/439; 148/440; 394/912

(58) Field of Classification Search ................. 428/650, 428/651, 652; 384/912; 420/528–554
See application file for complete search history.

(56) References Cited

U.S. PATENT DOCUMENTS

| | | | |
|---|---|---|---|
| 4,471,029 A | 9/1984 | Fukuoka et al. | |
| 4,471,030 A | 9/1984 | Fukuoka et al. | |
| 4,471,032 A | 9/1984 | Fukuoka et al. | |
| 4,471,033 A * | 9/1984 | Fukuoka et al. | 428/653 |
| 4,696,867 A * | 9/1987 | Eastwood | 428/650 |
| 4,707,194 A * | 11/1987 | Eastwood | 148/531 |
| 4,789,607 A | 12/1988 | Fujita et al. | |
| 4,857,267 A | 8/1989 | Maki et al. | |
| 4,957,822 A | 9/1990 | Steeg et al. | |
| 5,362,574 A | 11/1994 | Tanaka et al. | |
| 5,536,587 A | 7/1996 | Whitney, Jr. | |
| 6,221,515 B1 * | 4/2001 | Ramos Junior et al. | 428/653 |
| 6,309,759 B1 | 10/2001 | Tomikawa et al. | |
| 6,517,954 B1 * | 2/2003 | Mergen et al. | 428/653 |
| 6,875,290 B2 * | 4/2005 | Kagohara et al. | 148/437 |
| 7,323,254 B2 * | 1/2008 | Gartner | 428/610 |
| 2002/0034454 A1 | 3/2002 | Fujita et al. | |
| 2003/0012977 A1 * | 1/2003 | Mergen | 428/650 |
| 2004/0241489 A1 | 12/2004 | Kawachi et al. | |

(Continued)

FOREIGN PATENT DOCUMENTS

DE 28 53 724 6/1980

(Continued)

*Primary Examiner*—John J. Zimmerman
*Assistant Examiner*—Aaron Austin
(74) *Attorney, Agent, or Firm*—Collard & Roe, P.C.

(57) ABSTRACT

The invention relates to an aluminium alloy used as a coating for surfaces subjected to extreme friction stress, with an aluminium matrix incorporating at least a soft phase and a hard phase, as well as a process for producing the coating. The soft phase and/or the hard phase is essentially finely distributed in the aluminium matrix (20) and at least 80%, preferably at least 90%, of the soft phase or soft phase particles (18) have a mean diameter of a maximum of 3 μm. The aluminium alloy is produced by depositing it on the base (11) by a process of deposition from a gas phase.

20 Claims, 2 Drawing Sheets

U.S. PATENT DOCUMENTS

2005/0003225 A1 * 1/2005 Gartner .................. 428/610

FOREIGN PATENT DOCUMENTS

| DE | 36 31 029 C2 | 3/1987 |
| --- | --- | --- |
| DE | 36 40 698 | 6/1987 |
| DE | 37 29 414 | 3/1989 |
| DE | 39 06 402 | 9/1990 |
| DE | 40 26 907 | 2/1992 |
| DE | 43 12 537 C2 | 4/1993 |
| DE | 100 32 624 | 4/2001 |
| DE | 101 35 895 A1 | 4/2002 |
| DE | 10 2004 025 560 | 1/2005 |
| DE | 32 49 133 | 1/2005 |
| EP | 0 265 937 | 5/1988 |
| EP | 0 435 980 | 1/1991 |
| EP | 1 475 449 | 11/2004 |
| JP | 07-090551 | 4/1995 |
| RU | 2 076 960 | 4/1997 |
| RU | 2 145 982 | 2/2000 |
| RU | 2 186 869 | 8/2002 |
| RU | 2 218 277 | 12/2003 |

* cited by examiner

ALUMINUM ALLOY FOR SURFACES WHICH ARE SUBJECTED TO EXTREME STRESSES DUE TO FRICTION

CROSS REFERENCE TO RELATED APPLICATIONS

Applicants claim priority under 35 U.S.C. §119 of AUSTRIAN Patent Application No. A 1329/2004 filed on 3 Aug. 2004.

BACKGROUND OF THE INVENTION

1. Field of the Invention

This invention relates to an aluminium alloy intended to provide a protective coating for surfaces which are subjected to extreme stress due to friction, with an aluminium matrix incorporating at least a soft phase and a hard phase, which hard phase contains at least one element from a first group of elements comprising chromium, iron, cobalt, copper, manganese, nickel, molybdenum, magnesium, niobium, platinum, scandium, silver, silicon, vanadium, tungsten, zirconium and/or carbides, silicides, nitrides, borides of the elements from the first group of elements or inter-metallic phases from elements of the first element group, and/or inter-metallic phases of aluminium with the elements from the first element group, and the soft phase contains at least one element from a second element group comprising silver, aluminium, gold, bismuth, carbon (Graphite), calcium, copper, indium, magnesium, lead, palladium, platinum, scandium, tin, yttrium, zinc and lanthanoides, the soft phase element being different from the hard phase element, and also relates to a coating primarily meant for friction surfaces made of an aluminium alloy, a composite material comprising a base and a surface layer applied on top of the base, as well as a process for manufacturing a composite material comprising at least a substrate and a surface layer applied on top, as well as the use of this aluminium alloy for producing a friction surface layer for friction surfaces and for coating components subjected to stress due to friction.

2. Prior Art

Coatings meant for components subjected to stress due to friction have to meet exceedingly demanding requirements. Firstly, the intention is to provide a coating susceptible to as little friction as possible, which is relatively soft and as a result, has the characteristics to adapt to wear and tear and at the same time is able to adapt itself to the mating component. Apart from this it should also possess very high mechanical and tensile strength, in order to be in a position to absorb static as well as dynamic vibration loads, thereby increasing durability and service life. Development in the automobile industry is tending towards higher specific performance in order to increase the efficiency in view of increasingly tough standards governing exhaust emissions, thereby making internal combustion engines more economical and environmentally friendly. A large number of components in internal combustion engines are affected by this development, such as radial bearings which are subjected to extreme stress due to very high torques and the ever increasing compression ratios needed to optimise the combustion process, for example in the case of a direct-injection turbo-diesel engine. Standard friction bearings are not designed to take such loads and stresses. The high efficiency of fuel injection systems used with these engines also means that components of the injection pumps and their measuring instruments are subjected to high stress, as are other components due to higher performance, such as piston rods, pins or rollers, which are subjected to sliding friction and have to meet the demands of higher mechanical loads. Very often, aluminium alloys are used in such cases because they represent a good relationship between the properties which can be achieved and the costs that have to be met.

DE 36 31 029 C2 describes an aluminium alloy containing tin and its application in a two-layered bearing material. Due to the addition of other elements like such as tin, silicon and lead, a structure is obtained due to tin and lead alloy particles which have been precipitated from the aluminium matrix, which are precipitated adjacent to the silicon particles. The bearing material is therefore intended to exhibit better properties, such as higher fatigue resistance and greater protection against friction.

DE 101 35 895 A1 describes an aluminium alloy which contains aluminium-silicon-iron ternary inter-metallic compounds and silicon particles in the form of hard particles. The anti-blocking characteristics are improved as a result without reducing fatigue resistance.

U.S. Pat. No. 4,471,029 describes an aluminium-based alloy which contains silicon and tin as the alloying elements, in which the majority of the silicon particles have a diameter of >5 µm. This is meant to increase fatigue and friction resistance.

DE 43 12 537 C2 describes a multi-layered coating of aluminium alloys with a base, intermediate and bearing coatings, in which the bearing surface is made of an aluminium alloy containing tin and silicon with a Vickers hardness of <50. This is meant to increase compatibility and tolerance as well as fatigue resistance.

SUMMARY OF THE INVENTION

The objective of this invention is to propose an aluminium alloy with improved friction resistant characteristics.

This objective is achieved independently in each case by an aluminium alloy of the type outlined above, in which the soft phase and/or the hard phase are essentially distributed finely in the aluminium matrix and a minimum of 80% or, preferably 90%, of the soft phase particles have a mean diameter of a maximum of 3 µm, as well as a coating resulting from the same, a composite material comprising a surface layer made from the coating proposed by the invention, as well a process of the type outlined above, by which the surface layer is deposited on the base by a process of deposition from a gas phase to produce an aluminium alloy based on the invention. The advantage lies in the fact that it is now possible to produce an aluminium alloy with a structure which is such that the component coated with it has a high resistance to friction as well as high mechanical load bearing characteristics in spite of being subjected to static and dynamic loads. The soft phase particles have a very small mean diameter and are finely distributed in the aluminium matrix. Due to the modified grain structure, this fine distribution makes it difficult for a cohesive soft phase lattice to form, which would have a detrimental effect on the structural strength of the coating resulting from this alloy. In addition, it results in a high resistance to wear by abrasion and friction resistance whilst significantly improving the bedding characteristics. In the case of aluminium alloys known from the prior art, it has only been possible to achieve these characteristics at the expense of much poorer mechanical properties and reduced tensile strength. The fine distribution and small particle size of the soft phase elements prevents a weakening of the aluminium matrix, due to which the strength-enhancing hard phases can play their full role. For example, the structural strength or the sliding characteristics of the coating are not negatively affected due to the small quantities of soft phase particles which have a mean diameter greater than 3 µm. Since the coating proposed by the invention is produced by a process of deposition from a gas phase, it is possible to obtain a finely dispersed distribution of the hard and soft phases with a small mean particle size at the same time, without the need for a complex and hence cost-intensive finishing treatment for the component coated with the aluminium alloy proposed by the invention, nor is it necessary to add elements such as strontium to improve dispersion, as is the case with the prior art. Due to the almost spherical shape achieved or a shape which has no sharp-edged needles or spikes, the abrasion characteristics are improved and the ductility of the aluminium matrix, its tensile strength and elongation at break are also enhanced. All in all, the maximum abrasion resistance and bearing load is increased compared with standard bearings, resulting in better wear resistance, even in the case of bearings which are subjected to very high loads, as well a very high resistance to cavitation. Moreover, the coating proposed by the invention is easier to apply to geometrically simple surfaces e.g. friction bearings, compared with conventional methods such as plating of cast and rolled strips. It is also easier to provide a surface coat on complicated components or structures. As a result of this, it is now possible to apply coatings to very small surfaces with confidence and ease. Multi-layered coatings can also be applied without much extra effort. Overall, this results in very good coating properties and it is also now possible to control the coating thickness to meet specific requirements.

In other embodiments of the aluminium alloy in which the soft phases or the soft phase particles have a mean diameter of maximum 2 µm, in particular a maximum of 1 µm, and in which the soft phases or soft phase particles have a mean diameter in the range of 200 nm to 700 nm, preferably in the range of 350 nm to 550 nm, it is possible to increase the friction resistance of the coating still further, whilst nevertheless preserving high tensile strength.

Since at least 90%, preferably 95%, of the hard phases or hard phase particles have a smaller mean diameter than the soft phase particles, it is possible to achieve a high coating strength because the even and fine distribution of the hard phase particles prevents any local weakening of the aluminium matrix due to large agglomerates.

Since the mean diameter of the hard phase or hard phase particles is a maximum of 50%, preferably 25%, of the mean diameter of the soft phase or soft phase particles, it is now also possible to achieve a longer service life and a higher load-bearing capacity of the bearings due to the resultant improvements in the mechanical characteristics of the alloy.

In another embodiment, the proportion of soft phase is in the range of between 15% by weight and 45% by weight, preferably in the range of 20% by weight and 40% by weight, the advantage of which is that it is possible to achieve excellent sliding characteristics during operation and a high ability to adapt to the mating part during the run-in period. Furthermore, the alloy or a coating of the alloy exhibits highly improved properties even if over-stressed, thereby significantly increasing the service life of the friction bearings.

In another variant, the proportion of soft phase is maintained within the range of 23% by weight and 28% by weight, which enables the properties to be optimised, especially with regard to adaptability and friction properties, whilst maintaining the ratio between the friction characteristics and the desired tensile strength.

In other embodiments, the proportion of hard phase is maintained within the range of between 1.5% by weight and 40% by weight or in the range of between 2% by weight and 20% by weight, preferably in the range of between 2.5% by weight and 17% by weight.

The advantage of this is that the mechanical properties of the alloy or the coating can be adapted to satisfy a wide range of requirements and, specifically due to the increased wear resistance and structural strength of the coating, it can be employed in a wide range of applications. Furthermore aluminides or inter-metallic compounds may be formed which, due to their spherical shape, result in a strengthening of the matrix.

The hard phase may consists of silicon and/or the proportion of silicon in the alloy is in the range of between 3% by weight and 13.5% by weight, preferably in the range between 4% by weight and 11.5% by weight, or the proportion of silicon in the alloy is in the range of between 7.5% by weight and 8.5% by weight, the advantage of which is that the hard silicon particles improve anti-blocking and wear resistance properties as well as fatigue resistance. The silicon particles or silicon grains smooth out edges, burrs, etc. from the surface of the mating part, resulting in increased resistance to wear and tear by abrasion. Using a composition which is near the eutectic point leads to a fine distribution of silicon particles which has a positive effect with respect to the ductility or strength of the alloy or coating.

The hard phase may contain at least copper and the proportion of copper is in the range of between 0.5% by weight and 10% by weight, preferably in the range of between 1% by weight and 7% by weight. This results in higher strength due to hardening of the mixed crystals as well as increased fatigue resistance.

If the alloy is made up of 24% by weight to 26% by weight of tin, 7% by weight to 8% by weight of silicon and the balance is made up of aluminium with the normal impurities, an alloy is formed which exhibits a good characteristic profile in terms of friction-related compatibility and mechanical load-bearing capacity.

The proportion of hard phase may be either lower than or equal to the proportion of soft phase. This prevents the alloy from becoming too brittle due to excessive hardening.

Another embodiment of the coating is also possible, whereby the coating thickness lies in the range of between 5 µm and 40 µm, preferably in the range of between 10 µm and 25 µm, in which case the thickness can be adjusted to meet the demands of anticipated loads and thus make optimum use of the material.

In another embodiment of the composite material, an additional layer is provided between the base and the surface layer and acts as a diffusion barrier and/or an adhesive layer and by using a range of different layer structures, e.g. providing a steel protective coating with a view to increasing strength, a diffusion of atoms between these two layers can be actively prevented and a good adhesion of the coating proposed by the invention obtained.

The additional layer may have a thickness in the range of between 0.5 µm and 5 µm, preferably in the range of between 1 µm and 3 µm, which can result in better adhesive strength between the layers and produce a sufficiently strong diffusion barrier depending upon coating elements.

In another embodiment, the additional layer is made from a pure metal and/or binary or ternary alloy of an element from the first or second element group, the advantage of which is that clearly defined properties can be achieved and the diffusion coefficient can be maintained at the lowest level possible.

In another embodiment of the process, an additional layer is deposited between the base and the surface layer to act as a diffusion barrier or adhesive layer, the advantage of which is that the coating proposed by the invention adheres more efficiently, for example to a metallic supporting layer constituting the base, preventing a diffusion of atoms from the coating proposed by the invention.

Deposition from the gas phase may be implemented using a PVD process, the advantage of which is that the component to be coated is subjected to relatively little thermal stress, which means in particular that even thin-walled components can be coated without causing any distortion to the component.

In another embodiment, the PVD process is carried out using a sputtering process, in particular a direct current sputtering process, the advantage of which is that very high deposition rates can be achieved, making considerable savings in time and costs, whilst the equalising effect due to the electric voltage enables a better surface quality of the coating to be achieved.

In another embodiment, the process temperature is less than 90% of the melting temperature of the soft phase, the advantage of which is that it prevents the soft phase particles from melting completely and simultaneously ensures good adhesion of the particles with little thermal stress on the base.

If the deposition rate is greater than 0.1 µm/min, it advantageously results in an extremely high quality layer and also a relatively quick and hence economical method of producing the coating.

The sputtering process can be carried out very economically if argon is used as the sputtering gas.

The invention further relates to the use of the aluminium alloy for producing a friction coating for bearing elements, for example friction bearings, thrust rings or bushes, or for coating components which are subjected to extreme stress due to friction, for example shafts or connecting rods.

BRIEF DESCRIPTION OF THE DRAWINGS

To provide a clearer understanding of the invention, it will be explained with reference to the appended drawings. Of the simplified schematic drawings.

DETAILED DESCRIPTION OF PREFERRED EMBODIMENTS

Figure 1:
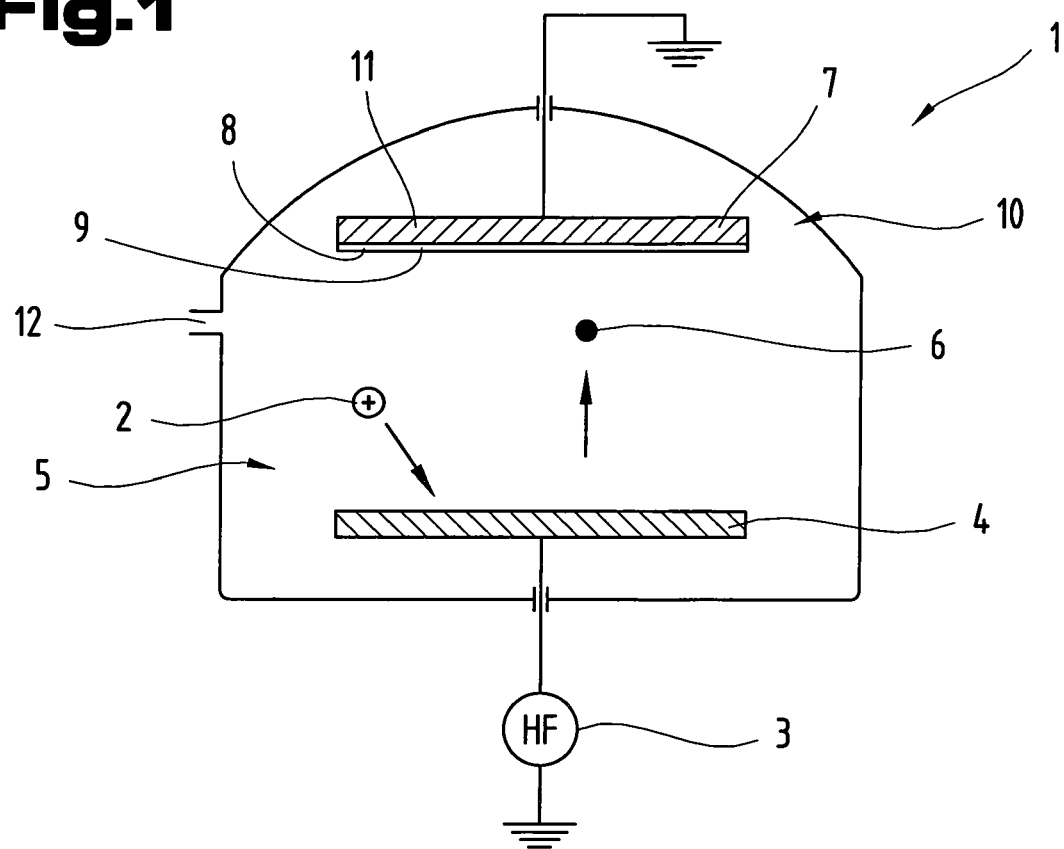
FIG. 1 is a diagram schematically illustrating the layout of a sputtering system.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc, relate to the drawing specifically being described and can be transposed in terms of meaning to a new position when another position is being described. Individual features or combinations of features from the different embodiments illustrated and described may be construed as independent inventive solutions or solutions proposed by the invention in their own right.

FIG. 1 shows a schematic layout of a sputtering unit 1. Surprisingly, the good properties of the aluminium alloy proposed by the invention, especially its small particle sizes and their distribution can be achieved by means of a deposition process from the gas phase.

As proposed by the invention, it is possible to use either a CVD- or PVD-process for deposition purposes.

In the case of the CVD-process (Chemical Vapour Deposition), the coating material can be formed by means of a chemical reaction of gaseous substances deposited directly on the surface parts to be coated.

Some of the parameters which influence the deposition rate as well as the composition and structure of the layers are as follows: composition of the gas atmosphere, temperature of the components to be coated, flow velocity of the coating gas as well as the coating time.

The CVD-process has an advantage in that it is possible to coat geometrically complex shapes or components or bases.

In the case of the PVD-process, the alloy proposed by the invention is converted to the gas phase by a physical process and is then deposited on the base surface by condensation.

The coating is formed as a combination of ions and neutral particles due to a plasma and the alloy is exposed to the plasma due to evaporation by means of an electron beam or an arc or by cathode sputtering.

In the case of cathode sputtering, the ions 2 are accelerated in an electric high-frequency field from an appropriate source 3 and directed onto the target electrode or target 4. In the case of such processes, the target 4 is the same as the cathode.

An ionised noble gas or a plasma 5 serves as the source for the ions 2. On reaching the target 4, the accelerated ions 2 spatter the atoms 6 from the surface of the target material and move these with increased velocity in the direction of the substrate 7 and deposit them there as coating 8.

In all these processes, it is naturally possible to increase the concentration of the applied coating by simultaneously applying heat during the coating process.

The substrate 7 need not be necessarily restricted to the flat plate shape illustrated in FIG. 1 because the invention also enables other shapes to be used, for example semicircular bearing shells or also full bearing shells, and the target 4 can be designed to accommodate this shape.

As proposed by the invention, the coating 8 can form the surface layer 9 of a composite material 10.

The substrate 7 forms the base 11 for the composite material 10. The base 11 may be a layer of steel, for example, or any other suitable material. The base 11 may also be a multi-layered metallic substrate 7.

It is also possible (although not shown in FIG. 1) to provide an additional layer, for example a diffusion barrier or adhesive layer, between the surface layer 9 and the base 11. This could be in the form of a lead bronze or pure metals.

As an example, one of various possible bearing designs is a bearing with an AlSn25Si7,5 mating surface. The base 11 may be a protective steel shell with a CuPb20Sn2 bearing metal layer. Another possible layer is a Ni intermediate layer which acts as a diffusion barrier and adhesive layer. The coating 8 proposed by the invention is applied to the Ni layer as a surface layer 9.

It should be noted that within the scope of the invention, the metallic layer of the bearing might contain lead, for example a bronze with 10% by weight of Pb and 10% by weight of Sn, and it would also be of advantage to provide an aluminium alloy using a copper-tin or copper-zinc alloy without any lead.

Several passages 12 may be provided, through which the sputter gas is delivered or by means of which a vacuum may be generated, for example.

In the case of direct current magnetron sputtering processes, argon at a pressure of $5 \times 10^{-3\ mbar}$ can be employed as the sputter gas.

Key parameters which influence the deposition rate, the layer-composition and layer structure are as follows: evaporation rate, particle pressure of the reaction gases, substrate voltage, subsidiary anode voltage, coating temperature.

It has proved possible to achieve good coating characteristics with a coating rate of approx. 0.75 μm at a coating temperature of 155° C., for example.

Experiments have shown that the friction limit load can be increased by 30% using the AlSn25Si7.5 sputter coating proposed by the invention compared with a standard AlSn20Cu sputtered bearing. It also increases wear resistance in the case of specific bearing loads above 100 Mpa.

Figure 2:
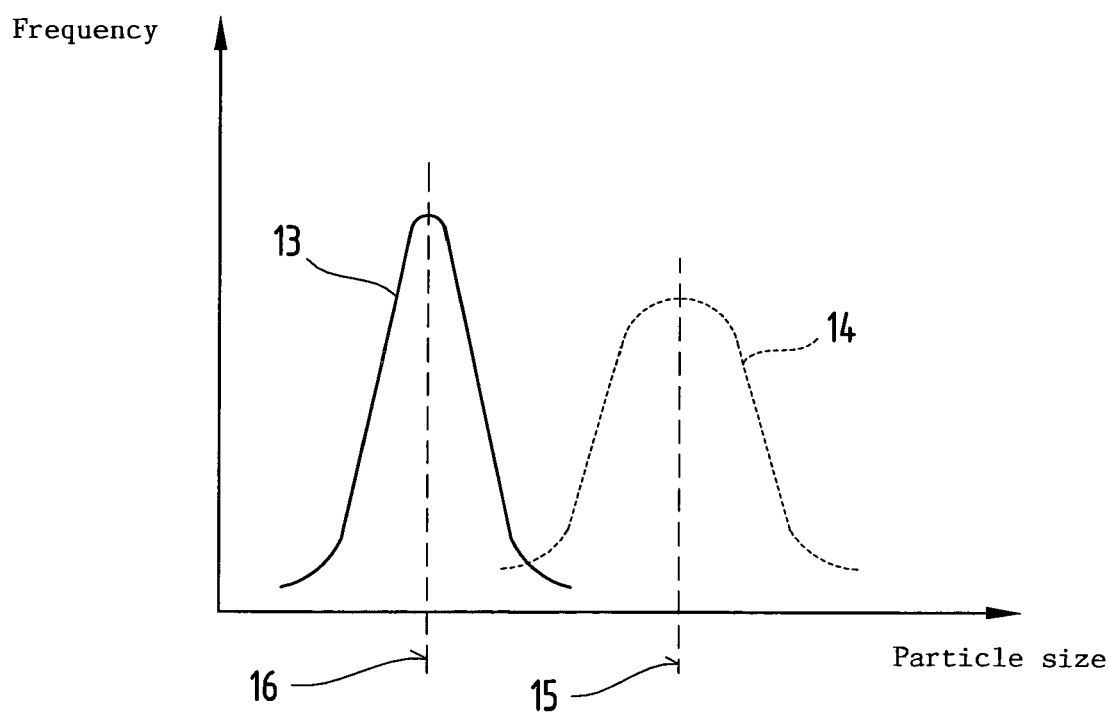
FIG. 2 schematically illustrates the frequency and distribution of the particles in the aluminium alloy.

FIG. 2 is a schematic diagram showing the frequency and distribution of the particles in the aluminium alloy.

A schematic curve 13 plots the frequency with which specific particle sizes of the hard phase or soft phase occur in the aluminium alloy proposed by the invention.

As a comparison, curve 14 plots the frequency with which specific particle sizes of the hard phase or soft phase occur in a corresponding alloy produced based on existing technology.

It should be noted that the term "particles" and details regarding their extent and distribution generally applies to the soft phases and hard phases, and in particular also to intermetallic phases and can be used interchangeably depending upon the interpretation of the term.

The term "soft phase" denotes those particles which impart a good flexibility and bedding-in characteristics for foreign bodies to the alloy or coating 8 proposed by the invention, and have a significantly lower hardness than the hard phases, which are responsible for high mechanical strength and fatigue resistance, amongst other things. Accordingly, the hard phases have a higher hardness than the pure aluminium matrix and thus lead to an increase in the hardness of the matrix.

As an approximation, it can be assumed that both curves 13, 14 are sufficient for a normal distribution since the deviation from the mean value conforms to a number of independent random variables.

The advantage of the aluminium alloy proposed by the invention is that it has very few medium sized particles compared with alloys produced using existing technology.

The median 15 is shifted towards the larger size particle or grains in the case of comparable aluminium alloys produced using existing technology.

As proposed by the invention, a minimum of 80% and preferably a minimum of 90% of the soft phase particles have a mean diameter of at most 3 μm.

Accordingly, the median 16 lies below an assumed normal distribution.

In some advantageous embodiments of the aluminium alloy proposed by the invention, a minimum of 80% and preferably at least 90% of the soft phase or the soft phase particles have a mean diameter of maximum 2 μm, and in particular 1 μm maximum.

At this point it should be mentioned that curves 13 or 14 shown in FIG. 1 represent the data of a static process only and would correspond to the actual process results only if a sufficiently large set of data were evaluated. This would enable deviations or asymmetric distributions in the actual curves to be evaluated.

The difference in the mean particle sizes as compared with those of the prior art increases if the soft phase or the soft phase particles have a mean diameter in the range of between 200 nm and 700 nm and in particular in the range of from 350 nm to 550 nm. The property profile of the aluminium alloy can be further improved due to the smaller sizes.

As also illustrated, the frequency distribution of the particle sizes of the aluminium alloys proposed by the invention is narrower than is the case with the aluminium alloys known from the prior art. This narrow curve 13 results in a more homogenous grain structure in the coating 8 than is the case with aluminium alloys known form the prior art. This results in an improvement in their mechanical properties, especially with respect to the static and dynamic loads which they are able to bear. Accordingly, the characteristic values of a coating 8 can be more readily reproduced, thereby reducing the quantity of waste when working to tight specifications.

Curve 13 essentially also applies to the hard phase particles which are dispersed in the aluminium matrix, if, in another advantageous embodiment of the invention, at least 90%, preferably 95%, of the hard phase particles have a lower mean diameter than the soft phase particles.

Due to the smaller particle size of the soft phase and the hard phases of the aluminium alloy proposed by the invention, a coating 8 with good friction resistance and a high mechanical load-bearing capacity can be obtained in spite of a high content of soft phase particles. The additional advantage of this is a reduced notch effect of individual hard phases, for example silicon.

The coating 8 obtained has a high hardness whilst at the same time avoiding any tendency to embrittlement. This results in better mechanical properties compared with alloys produced using present day technologies.

The coating 8 may have a hardness in the range of between 115 HV 0.001 and 150 HV 0.001, especially between 120 HV 0.001 and 145 HV 0.001, in which case it is possible to achieve a coating of higher strength and mechanical stability, especially in the case of high static loads.

The table below shows the some of the variants of the aluminium alloy, the figures for which denote % by weight by reference to the aluminium alloy.

|    | Sn   | Si   | Cu   | Mn   | Mg | Cr   | Co   | Zr   | Zn | Fe   | Ni   | Al   |
|----|------|------|------|------|----|------|------|------|----|------|------|------|
| 1  | 18,5 | 0,2  | 1,5  | 0,15 | —  | —    | 0,25 | —    | —  | —    | 0,75 | Rest |
| 2  | 18   | 7,5  | —    | 0,35 | —  | —    | 0,5  | —    | —  | 0,6  | 0,65 | Rest |
| 3  | 25   | 7,5  | —    | —    | —  | —    | —    | —    | —  | —    | —    | Rest |
| 4  | 24,5 | 7,5  | —    | —    | —  | —    | —    | —    | —  | 0,15 | —    | Rest |
| 5  | 30   | 7,5  | —    | —    | —  | —    | —    | —    | —  | 0,15 | —    | Rest |
| 6  | 24,5 | 14,5 | —    | —    | —  | —    | —    | —    | —  | 0,15 | —    | Rest |
| 7  | 30   | 14,5 | —    | —    | —  | —    | —    | —    | —  | 0,15 | —    | Rest |
| 8  | 24,5 | —    | 1,2  | 0,5  | —  | 0,1  | 0,1  | 0,1  | —  | 0,15 | —    | Rest |
| 9  | 23   | <0,2 | 1,1  | 0,4  | —  | 0,05 | 0,05 | 0,05 | —  | 0,05 | —    | Rest |
| 10 | 27   | <0,2 | 1,85 | 0,8  | —  | 0,15 | 0,15 | 0,15 | —  | 0,25 | —    | Rest |

-continued

| | Sn | Si | Cu | Mn | Mg | Cr | Co | Zr | Zn | Fe | Ni | Al |
|---|---|---|---|---|---|---|---|---|---|---|---|---|
| 11 | 25 | 1,5 | 1,0 | — | 1,0 | — | — | 0,1 | 4,5 | — | — | Rest |
| 12 | 25 | 12 | 0,5 | — | 1,0 | — | — | — | — | — | — | Rest |
| 13 | 25 | 7,5 | 1 | — | 1 | — | — | — | — | — | 1 | Rest |
| 14 | 25 | 3,5 | 1 | — | 1 | — | — | — | — | — | 1 | Rest |
| 15 | 24,5 | — | 1,2 | 0,5 | — | — | 0,1 | 0,1 | — | 0,15 | — | Rest |
| 16 | 15 | 10 | 1,1 | — | — | 1,5 | — | — | 0,5 | 1 | — | Rest |
| 17 | 40 | — | 2,5 | — | — | 2 | — | — | 2 | 1,34 | 0,45 | Rest |
| 18 | 18,5 | 2,2 | 0,95 | — | — | 1,1 | — | — | 3,4 | 2 | — | Rest |
| 19 | 22 | — | 4 | — | — | — | — | 0,55 | 1 | 3,4 | — | Rest |
| 20 | 21,3 | — | 2,2 | — | — | — | — | 1,2 | — | 1 | — | Rest |
| 21 | 31,5 | — | 2,2 | 15,1 | — | — | 1,5 | — | — | — | — | Rest |
| 22 | 17 | — | — | — | — | — | 2,21 | 2 | 3,75 | 0,45 | — | Rest |
| 23 | 19 | 3,4 | — | — | — | — | 2,2 | 1,1 | 1 | 1,1 | — | Rest |
| 24 | 22 | 8 | — | — | — | — | 3 | 0,9 | 0,25 | 0,75 | — | Rest |
| 25 | 23,5 | 11 | — | — | — | — | 2,4 | 0,8 | 0,21 | — | — | Rest |
| 26 | 25 | 4,5 | — | — | — | — | 0,45 | 1 | 1 | — | — | Rest |
| 27 | 26 | — | — | — | 1,21 | 1,23 | — | — | — | — | — | Rest |
| 28 | 21,5 | — | — | 2,4 | — | — | — | — | — | — | — | Rest |
| 29 | 22 | — | 2,3 | — | 0,35 | — | — | — | — | 3,4 | — | Rest |
| 30 | 35 | — | 3,7 | — | — | — | 2,5 | 1,15 | — | — | 1,75 | Rest |
| 31 | 41 | — | 5,6 | — | — | — | 2,3 | — | — | 2,45 | 3,2 | Rest |
| 32 | 28 | — | 2,5 | — | — | 2,4 | — | — | — | 1 | 0,9 | Rest |
| 33 | 28 | 4,5 | — | 1 | — | 0,65 | — | — | 4,4 | 1 | — | Rest |

As an example, a few of the alloys listed in the table which exhibit special characteristics are given below:

No. 3, 4: the composition of the AlSi-matrix lies very close to the eutectic point resulting in an exceedingly fine grained structure. This in turn results in good mechanical properties.

No. 6: likewise a fine-grained structure, improved friction resistance characteristics compared with 3, 4.

No. 9: lower soft phase content, good mechanical properties.

No. 10: Good matrix strength.

No. 11: high matrix strength, self hardening effect.

No. 12: hardening effect due to a $Mg_2$ phase.

The aluminium alloys described above are only examples from a large selection of other alloys, which could not be described here in totality in order not to deviate from the scope of this description, and the above should not to be considered a limitation to the scope of application of the invention. The person skilled in this field would be able, based on the described teaching, to produce aluminium alloys with other combinations of elements within the specified limits and these combinations are not excluded from the protective scope. This also applies in particular to the claimed element combinations for which examples have not been cited in the table above, such as Bi, C, In, Pb, Pd, Pt, Y, Ce, Pr, Nd, Sm, Eu, Gd, Tb, Dy, Ho, Er, Tm, Yb, Lu, which may be used alone or in combination with one other, and with other elements mentioned in the claims or in the tables above in the alloy proposed by the invention within the proportions specified in the claims.

As proposed by the invention, the proportion of soft phase lies between 15% by weight and 45% by weight, preferably between 20% by weight and 40, which reduces the tendency to abrasion.

The hard phase may be silicon and the proportion in the alloy lies in the range of between 3% by weight and 13.5% by weight, preferably in the range of between 4% by weight and 11.5% by weight.

Adding silicon increases resistance to wear as well as fatigue strength. Silicon is dispersed in the aluminium matrix and has the effect of strengthening the aluminium matrix due to its high hardness, whilst simultaneously imparting high temperature resistance due to the high thermal stability of silicon.

For the purpose of the invention, the hard phase may account for a proportion of between 1.5% by weight and 40% by weight or between 2% by weight and 20% by weight, in particular between 2.5% by weight and 17% by weight, and may also contain elements or inter-metallic phases of aluminium and elements from the first element group comprising chromium, iron, cobalt, copper, manganese, nickel, molybdenum, magnesium, niobium, platinum, scandium, silver, silicon, vanadium, tungsten, zirconium and/or carbides, silicides, nitrides, borides of the elements from the first element group or inter-metallic phases from the elements in the first element group.

Due to the formation of inter-metallic phases the mechanical properties are improved, for example the strength or fatigue resistance.

As proposed by the invention, several other elements from the first element group may be added to the aluminium alloy, thereby enabling its properties to be specifically adjusted.

Copper and magnesium, for example, strengthen the matrix without impairing the ductility of the material. Resistance to fatigue is also increased.

Chromium, manganese and iron increase hardness and hence the mechanical strength due to the formation of inter-metallic phases with aluminium.

Manganese, apart from increasing the strength, also increases corrosion resistance.

Adding zirconium and/or nickel enables the formation of inter-metallic compounds which improve the fatigue resistance of the coating.

Figure 3:
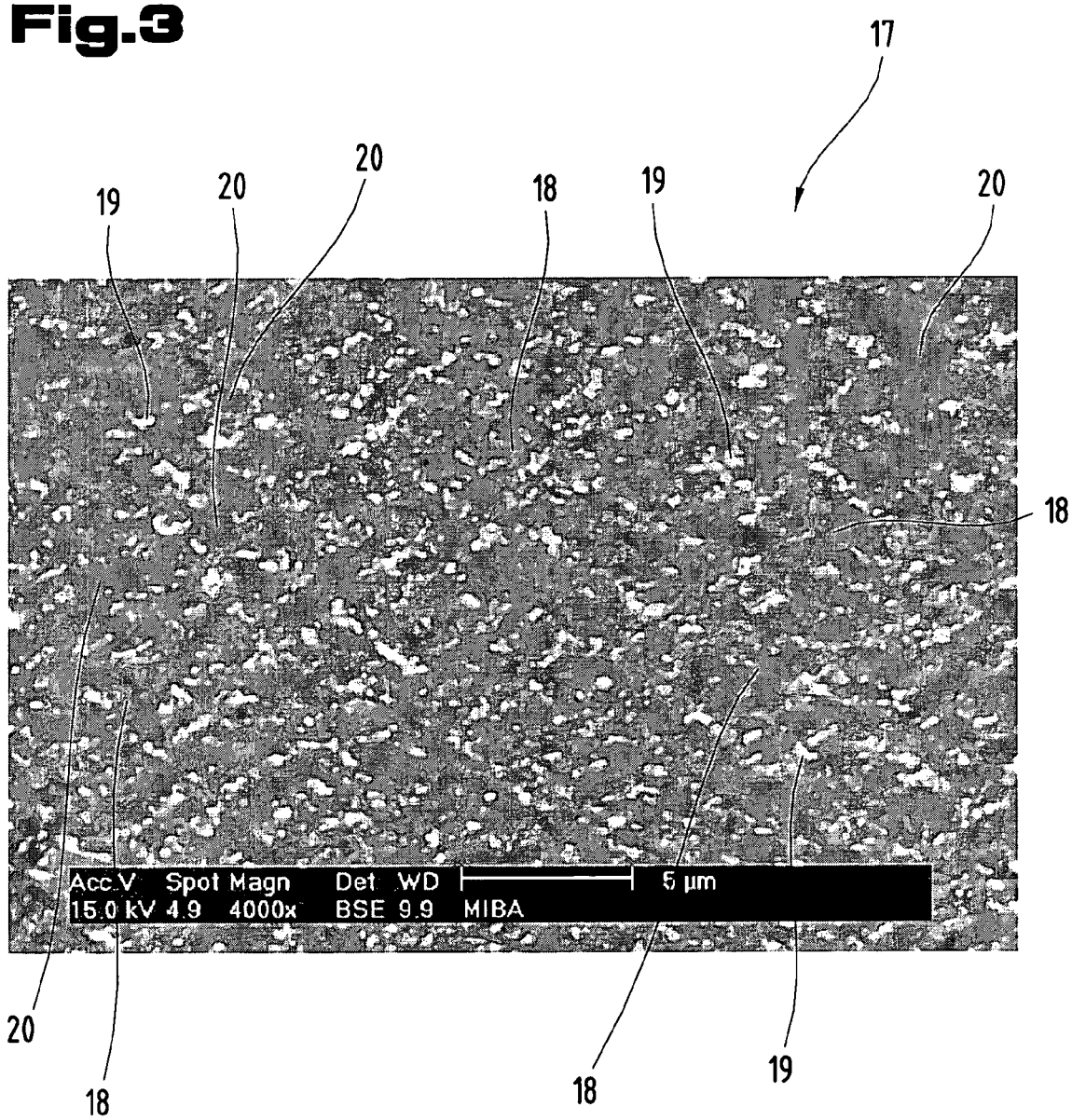
FIG. 3 shows a micrograph of a coating using one possible aluminium alloy.

FIG. 3 shows a micrograph of a coating 8 of one possible aluminium alloy in which tin is used as the soft phase and the hard phase contains predominantly silicon.

This contains approximately 7.5% by weight of silicon, 18% by weight of tin and a few other elements such as manganese, iron, cobalt and nickel, the total percentage of these being below 2% by weight and can be ignored for the purpose of interpreting FIG. 3.

As may be seen from the micrograph 17, the soft phase particles-18 (medium brightness) as well as the hard phase particles 19 (bright areas) are finely dispersed in a globular shape in an aluminium matrix-20 (dark areas). The agglomerate content is very minimal and therefore can not cause any deterioration in the properties of the coating 8.

All told, this results in the previously mentioned advantages in terms of the mechanical and friction related properties of the coating 8 proposed by the invention.

The magnification and scale of the micrograph 17 can be seen on the bottom edge of FIG. 3.

The embodiments described as examples illustrate possible variants of the alloy and the coating 8 but it should be pointed out that the invention is not limited just to the variants which have been described, and it is possible to use combinations of these variants with each other, these variants lying within the capability of a person skilled in this technical field based on the technical teaching. Also possible are all conceivable variants which can be obtained by combinations of the individual details of the embodiments illustrated and described, all of which fall within the protective scope of the patent.

Finally it should be stated here that in order to gain a better understanding of the construction of the coating 8 and the sputtering unit 1, they and their constituent components are illustrated to a certain extent out of scale and/or on an enlarged and/or reduced scale.

The independent solutions proposed by the invention and the underlying objectives may be found in the description.

Above all, the individual constructions shown in FIG. 1;2;3 may be construed as independent solutions proposed by the invention. The objectives and solutions proposed by the invention may be found in the detailed descriptions of these drawings.

| List of Reference Numbers | |
|---|---|
| 1 | Sputtering unit |
| 2 | Ions |
| 3 | Source |
| 4 | Target |
| 5 | Plasma |
| 6 | Atom |
| 7 | Substrate |
| 8 | Coating |
| 9 | Surface layer |
| 10 | Composite material |
| 11 | Base |
| 12 | Passage |
| 13 | Curve |
| 14 | Curve |
| 15 | Median |
| 16 | Median |
| 17 | Micrograph |
| 18 | Soft phase particle |
| 19 | Hard phase particle |
| 20 | Aluminum matrix |

What is claimed is:

1. An aluminum alloy for providing a coating for bearing elements, the alloy having an aluminum matrix and comprising:
    (a) a soft phase; and
    (b) a hard phase;
    wherein said hard phase is made up of at least one element from a first group of elements comprising chromium, iron, cobalt, copper, manganese, nickel, molybdenum, magnesium, niobium, platinum, scandium, silver, silicon, vanadium, tungsten, zirconium or carbides, silicides, nitrides, borides of the elements of the first element group or inter-metallic phases from elements of the first element group;
    wherein said soft phase is made up of at least one element from a second group of elements comprising silver, aluminum, gold, bismuth, graphite, calcium, copper, indium, magnesium, lead, palladium, platinum, scandium, tin, yttrium, zinc and lanthanoides;
    wherein the soft phase is different from the hard phase;
    wherein the soft phase and the hard phase is essentially finely distributed in the aluminum matrix;
    wherein at least 80% of the soft phase or soft phase particles have a mean diameter of a maximum of 3 μm; and
    wherein at least 90% of the hard phase or hard phase particles have a smaller mean diameter than the soft phase particles.

2. The aluminum alloy as claimed in claim 1, wherein the soft phase or the soft phase particles have a mean diameter of a maximum of 2 μm.

3. The aluminum alloy as claimed in claim 1, wherein the soft phase or the soft phase particles have a mean diameter in the range of 200 nm to 700 nm.

4. The aluminum alloy as claimed in claim 1, wherein at least 95% of the hard phase or hard phase particles have a smaller mean diameter than the soft phase particles.

5. The aluminum alloy as claimed in claim 4, wherein the mean diameter of the hard phase or hard phase particles is a maximum of 50% of the mean diameter of the soft phases or soft phase particles.

6. The aluminum alloy as claimed in claim 1, wherein the proportion of soft phase is in the range of between 15% by weight and 45% by weight.

7. The aluminum alloy as claimed in claim 1, wherein the proportion of soft phase is in the range of between 23% by weight and 28% by weight.

8. The aluminum alloy as claimed in claim 1, wherein the proportion of hard phase is in the range of between 1.5% by weight and 40% by weight.

9. The aluminum alloy as claimed in claim 1, wherein the proportion of hard phase is in the range of between 2% by weight and 20% by weight.

10. The aluminum alloy as claimed in claim 1, wherein the proportion of silicon in the alloy is in the range of between 3% by weight and 13.5% by weight.

11. The aluminum alloy as claimed in claim 1, wherein the proportion of silicon in the alloy is in the range of between 7.5% by weight and 8.5% by weight.

12. The aluminum alloy as claimed in claim 1, wherein the hard phase contains copper and the proportion of copper is in the range of between 0.5% by weight and 10% by weight.

13. The aluminum alloy as claimed in claim 1, wherein the alloy is made up of 24% by weight to 26% by weight of tin, 7% by weight to 8% by weight of silicon and the balance is aluminum and the usual impurities.

14. The aluminum alloy as claimed in claim 1, wherein the proportion of hard phase is smaller than or equal to the proportion of soft phase.

15. A coating for bearing elements, made from an aluminum alloy, wherein the aluminum alloy is as claimed in claim 1.

16. The coating as claimed in claim 15, wherein the coating has a thickness in the range of between 5 μm and 40 μm.

17. A composite material made up of at least a base and a surface layer applied on top, wherein the surface layer is a coating as claimed in claim 15.

18. The composite material as claimed in claim 17, further comprising an intermediate layer provided as a diffusion barrier or an adhesive layer between the base and the surface layer.

19. The composite material as claimed in claim 18, wherein the thickness of the intermediate layer is in the range of between 0.5 µm and 5 µm.

20. The composite material as claimed in claim 18, wherein the additional layer is made from a pure metal or a binary or ternary alloy of an element from the first or second element group.

* * * * *